United States Patent
Rudmann et al.

(10) Patent No.: US 9,887,221 B2
(45) Date of Patent: Feb. 6, 2018

(54) OPTICAL MODULES INCLUDING CUSTOMIZABLE SPACERS FOR FOCAL LENGTH ADJUSTMENT AND/OR REDUCTION OF TILT, AND FABRICATION OF THE OPTICAL MODULES

(71) Applicant: Heptagon Micro Optics Pte. Ltd., Singapore (SG)

(72) Inventors: Hartmut Rudmann, Jona (CH); Jukka Alasirniö, Jääli (FI); Bojan Tesanovic, Eglisau (CH); Tobias Senn, Zurich (CH); Devanraj Kupusamy, Singapore (SG); Alexander Bietsch, Thalwil (CH)

(73) Assignee: Heptagon Micro Optics Pte. Ltd., Singapore (SG)

( * ) Notice: Subject to any disclaimer, the term of this patent is extended or adjusted under 35 U.S.C. 154(b) by 0 days.

(21) Appl. No.: 15/119,182

(22) PCT Filed: Feb. 18, 2015

(86) PCT No.: PCT/SG2015/000050
§ 371 (c)(1),
(2) Date: Aug. 16, 2016

(87) PCT Pub. No.: WO2015/126328
PCT Pub. Date: Aug. 27, 2015

(65) Prior Publication Data
US 2017/0012069 A1    Jan. 12, 2017

Related U.S. Application Data

(60) Provisional application No. 61/941,009, filed on Feb. 18, 2014, provisional application No. 61/949,468, (Continued)

(51) Int. Cl.
*H01L 31/0232* (2014.01)
*H01L 27/146* (2006.01)
(Continued)

(52) U.S. Cl.
CPC ........ *H01L 27/14618* (2013.01); *H01L 24/48* (2013.01); *H01L 27/1462* (2013.01);
(Continued)

(58) Field of Classification Search
None
See application file for complete search history.

(56) References Cited

U.S. PATENT DOCUMENTS

2005/0163016 A1    7/2005 Kimura
2006/0045410 A1    3/2006 Trott et al.
(Continued)

FOREIGN PATENT DOCUMENTS

EP    1 708 476 A2    10/2006
WO    2004/070438    8/2004
(Continued)

OTHER PUBLICATIONS

Australian Patent Office, International Search Report for International Patent Application No. PCT/SG2015/000050, dated Jun. 5, 2015.
(Continued)

*Primary Examiner* — Telly Green
(74) *Attorney, Agent, or Firm* — Fish & Richardson P.C.

(57) ABSTRACT

Optical modules are made using customizable spacers to reduce variations in the focal lengths of the optical channels, to reduce the occurrence of tilt of the optical channels, and/or prevent adhesive from migrating to active portions of an image sensor.

5 Claims, 21 Drawing Sheets

Related U.S. Application Data filed on Mar. 7, 2014, provisional application No. 62/028,150, filed on Jul. 23, 2014, provisional application No. 62/044,591, filed on Sep. 2, 2014, provisional application No. 62/100,615, filed on Jan. 7, 2015.

(51) Int. Cl.
 *H01L 23/00* (2006.01)
 *H04N 5/225* (2006.01)

(52) U.S. Cl.
 CPC .. *H01L 27/14625* (2013.01); *H01L 27/14632* (2013.01); *H01L 27/14685* (2013.01); *H01L 27/14687* (2013.01); *H04N 5/2253* (2013.01); *H04N 5/2254* (2013.01); *H04N 5/2257* (2013.01); *H04N 5/2258* (2013.01); *H01L 2224/48091* (2013.01); *H01L 2224/48225* (2013.01); *H01L 2924/181* (2013.01)

(56) References Cited

U.S. PATENT DOCUMENTS

| | | |
|---|---|---|
| 2009/0002853 A1 | 1/2009 | Yuan |
| 2009/0033789 A1 | 2/2009 | Lin |
| 2014/0125849 A1 | 5/2014 | Heimgartner et al. |

FOREIGN PATENT DOCUMENTS

| | | |
|---|---|---|
| WO | WO 2007/043509 | 4/2007 |
| WO | WO 2009/105547 | 8/2009 |
| WO | 2010/074743 | 7/2010 |
| WO | 2011/049635 | 4/2011 |
| WO | 2011/133746 | 10/2011 |
| WO | 2012/022000 | 2/2012 |
| WO | 2013/026175 | 2/2013 |

OTHER PUBLICATIONS

European Patent Office, Search Report issued in European Application No. 15752483.6, dated Oct. 12, 2017 (4 pages).

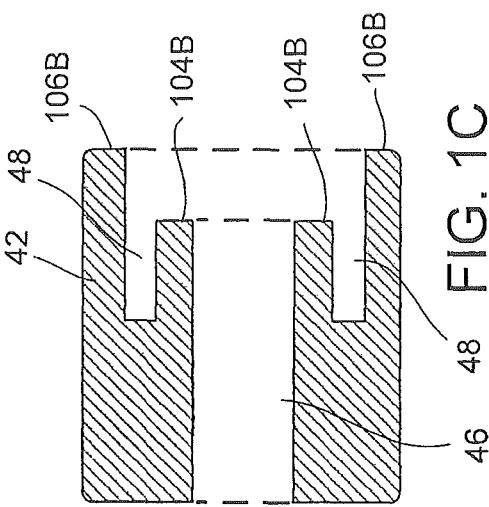
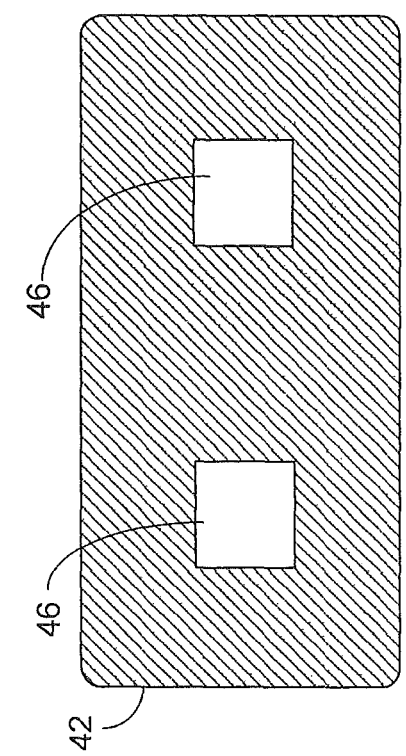
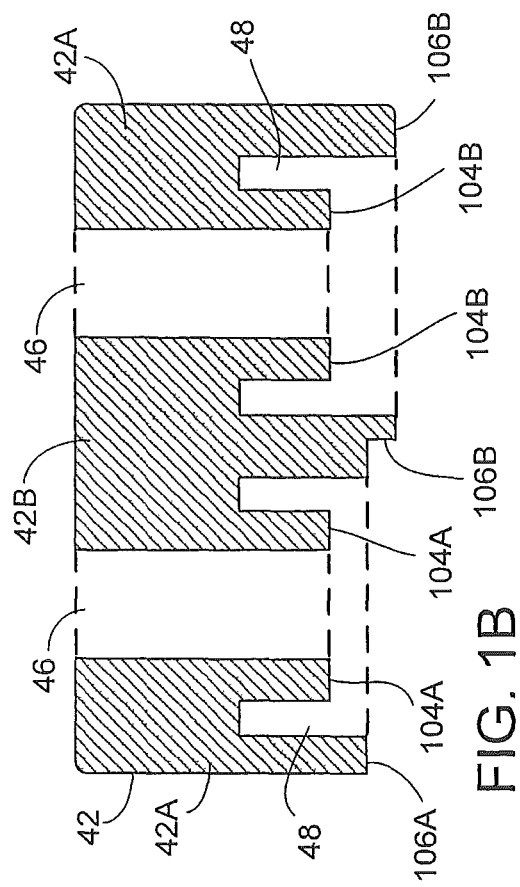
FIG. 1A
FIG. 1B
FIG. 1C

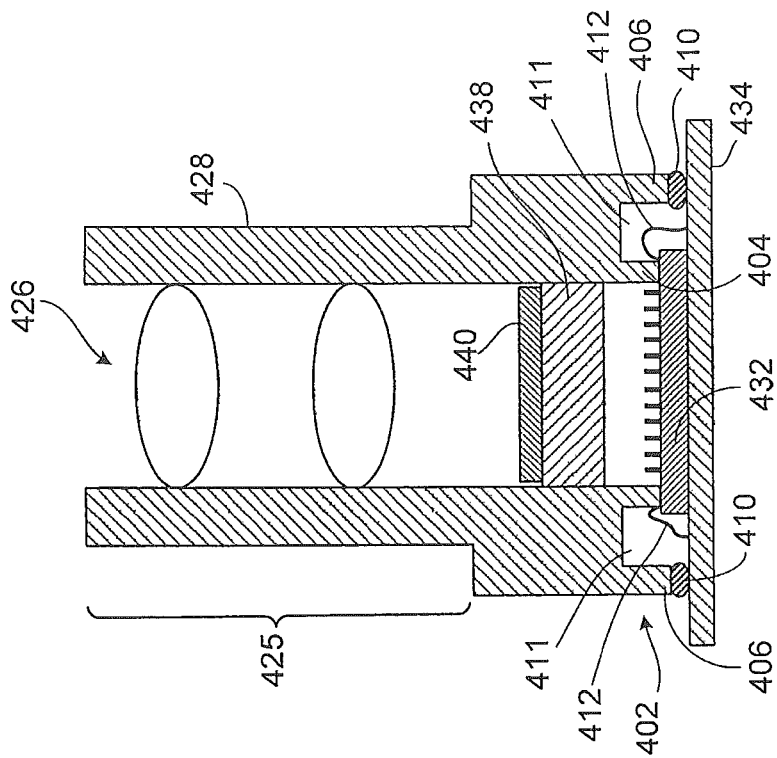
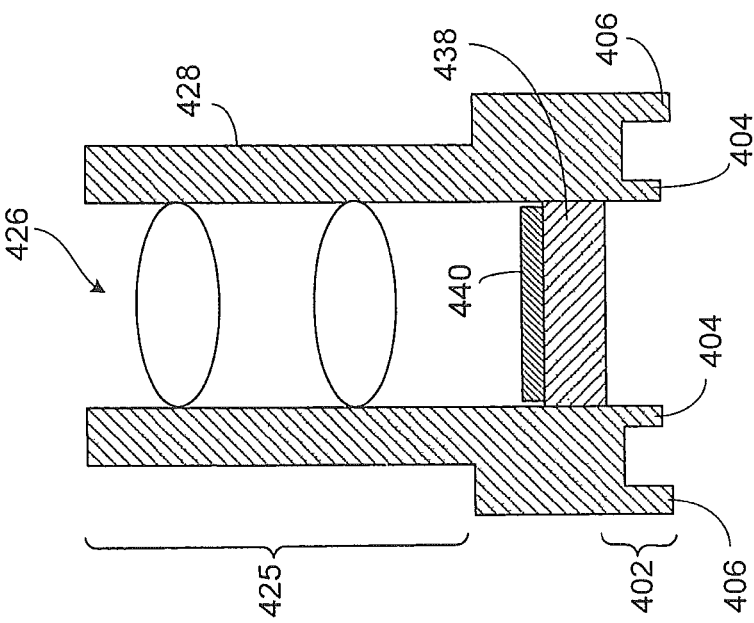
FIG. 7B
FIG. 7A

OPTICAL MODULES INCLUDING CUSTOMIZABLE SPACERS FOR FOCAL LENGTH ADJUSTMENT AND/OR REDUCTION OF TILT, AND FABRICATION OF THE OPTICAL MODULES

FIELD OF THE DISCLOSURE

This disclosure relates to optical modules for image sensing devices such as cameras, and other devices. It also relates to methods of manufacturing such modules.

BACKGROUND

During the manufacture of devices, such as optical modules for array cameras, manufacturing irregularities or manufacturing deviations may occur, for example, because of more or less unavoidable variations or inaccuracies in one or more of the process steps. For example, when the optical devices include one or more passive optical elements such as lenses, the devices may have focal lengths that slightly vary one from the other despite having the same nominal focal length. In some cases, the focal length may correspond to the flange focal length (FFL), or more generally, the focal length may refer to any focal length parameter (e.g., the effective focal length (EFL)). In any event, variations in the focal lengths can result in the focal plane of the lens system lying off the image sensor plane, which can lead to inferior image quality.

Another problem that can arise, for example, in array cameras is shifting of the optical axes of the various optical channels as a result of thermal expansion of the lens stacks. In some cases, thermal expansion can cause the various optical channels to shift laterally with respect to the image sensor plane. Thermal expansion also may cause the optical channels to become tilted with respect to the desired optical axis. Thus, thermal expansion also can lead to inferior image quality.

Additional problems that can arise relate to the use of adhesive in the optical assembly and/or tilt of the barrel lens or optical assembly. For example, a lens barrel or optical stack may be attached to a transparent wafer with adhesive, or an optical assembly may be attached to another substrate (e.g., a printed circuit board (PCB) or image sensor) with adhesive. The adhesive must be applied with precision and accuracy because uneven, unequal distribution of adhesive may cause tilt in the barrel/lens stack or tilt in the optical assembly, which can result in reduced image quality. In addition, if not controlled properly, adhesive may migrate to the active portion of the image sensor, which can result in the optical modules being unusable.

SUMMARY

The present disclosure describes optical modules and methods of fabricating the optical modules. Various approaches are described to provide adjustments to reduce variations in the focal lengths of the optical channels, to reduce the occurrence of tilt of the module's optical channels, and/or prevent adhesive from migrating to active portions of the image sensor.

For example, in one aspect, an optical module includes active optoelectronic components each of which is mounted on a respective printed circuit board, wherein each of the active optoelectronic components is associated with a respective different optical channel. A transparent cover extends over the active optoelectronic components and is substantially transparent to one or more wavelengths of light detectable or emitted by the active optoelectronic components. The module includes beam shaping systems, each of which is associated with a different one of the optical channels and which is disposed over the transparent cover. A spacer separates the active optoelectronic components and printed circuit boards from the transparent cover. A first one of the active optoelectronic components is separated, by the spacer, from the transparent cover by a first distance, and a second one of the active optoelectronic components is separated by the spacer from the transparent cover by a different second distance.

Some implementations provide one or more of the following features. For example, the spacer can include first edge features attached to top surfaces of the active optoelectronic components and second edge features attached to top surfaces of the printed circuit boards. The second edge features can be attached to the top surfaces of the printed circuit boards by adhesive. In some cases, the spacer is a single monolithic piece, and the transparent cover has a substantially uniform thickness. The spacer may have trenches that provide space for electrical connections from the active optoelectronic components to the printed circuit boards. The trenches also may provide space and protection for adhesive. In some cases, a protective hood laterally surrounds a periphery of the transparent cover. The module also may include auto-focus components, each of which is disposed respectively over a corresponding one of the beam shaping systems. A respective electrically conductive connection can be provided from each auto-focus component to a corresponding one of the printed circuit boards.

In another aspect, an optical module includes an image sensor on a substrate. A beam shaping system is disposed over a photosensitive region of the image sensor. A spacer separates the beam shaping system from the image sensor. The spacer includes an alignment edge in direct contact with a surface of the image sensor, and further includes an adhesion edge attached to the surface of the image sensor or to a surface of the substrate by adhesive.

The present disclosure also describes various methods for fabricating these and other optical modules. For example, in some implementations, a wafer-level fabrication process can be used to make multiple optical modules at the same time.

In some implementations, the spacer portions are provided as a spacer wafer. The method also may include a separating step to form the plurality of optical modules.

Some implementations provide one or more of the following advantages. For example, by providing for focal length adjustment during the fabrication process, variations in the focal length from one channel to another can be reduced. More generally, the focal length of each channel in a single-channel module or a multi-channel module can be made closer to the nominal focal length. Further, by providing a single transparent cover that extends across the entire array of image sensors (or other active optoelectronic components), thermal expansion and its associated adverse consequences can be reduced. Some implementations can help eliminate or reduce tilt in the optical channels. Some features can help reduce the effects of stray light and optical cross-talk in the module. Further, various features can be provided to help protect wiring that couples the image sensors to the PCBs on which they are mounted, as well as wiring that couples auto-focus components to the PCBs. The modules and techniques described here can lead, for example, to array cameras having improved image quality.

Other aspects, features and advantages will be apparent from the following detailed description, the accompanying drawings and the claims.

BRIEF DESCRIPTION OF THE DRAWINGS

FIGS. 1A, 1B and 1C illustrate, respectively, a top cross-sectional view and side cross-sectional views of a spacer for the implementation of FIG. 1.

FIGS. 7A and 7B illustrate an example of a customizable spacer for a single channel module.

DETAILED DESCRIPTION

Figure 1:
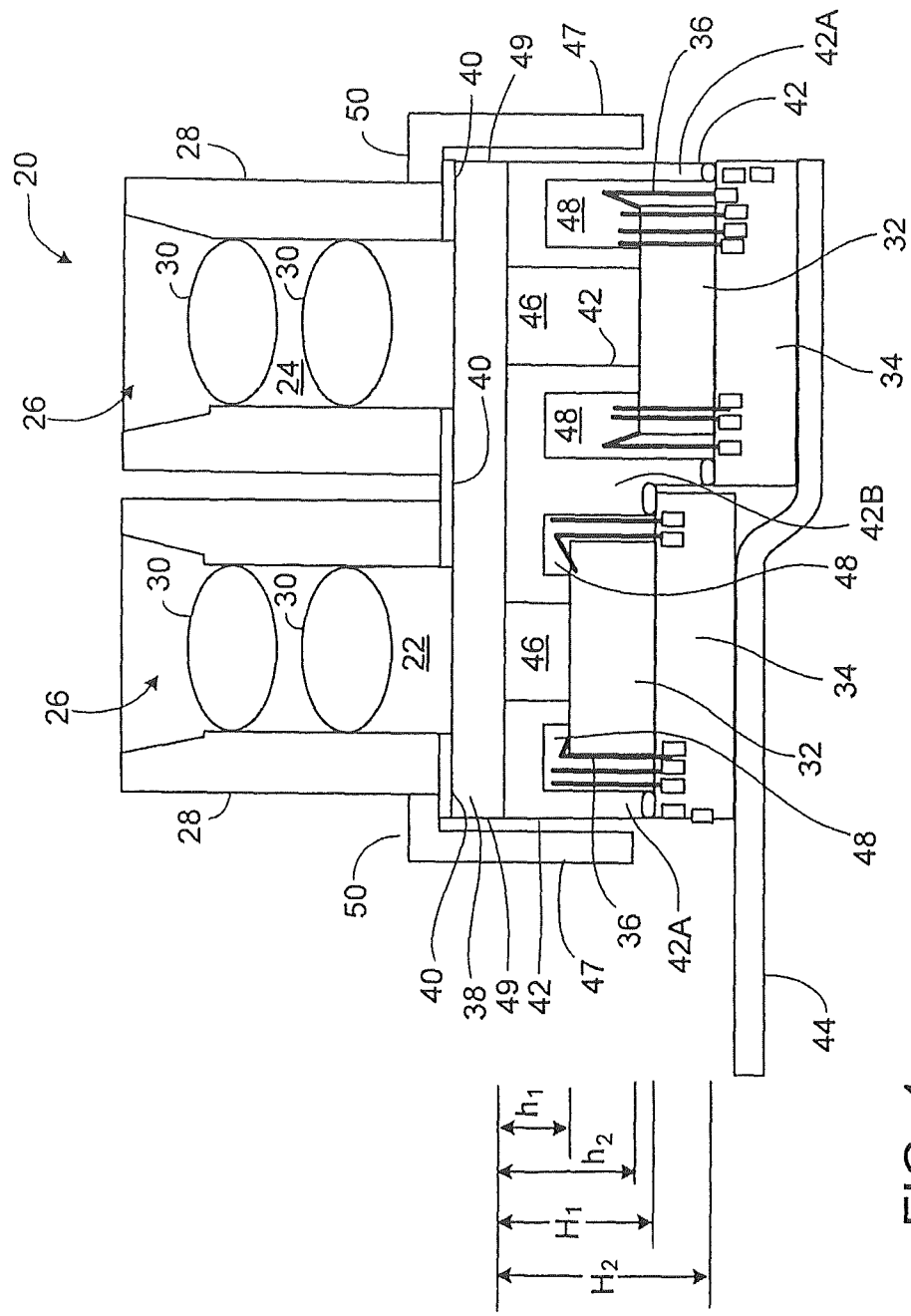
FIG. 1 is an example of a multi-channel module having a customized spacer.

As shown, in FIG. 1, a module 20 for a compact array camera or other imaging device includes multiple optical channels 22, 24, each of which has a respective beam shaping system such as a lens stack 26 held by a lens barrel 28. The lens barrels 28 can be composed, for example, of an injection molded epoxy material. In the illustrated example, each lens stack 26 includes multiple lens elements 30 stacked one over the other and intersecting the optical axis of the particular channel 22, 24. In some implementations, only a single beam shaping element (e.g., lens) may be provided for each optical channel. Each lens stack 26 is substantially aligned with a respective monolithic image sensor 32, which can be implemented, for example, as a CCD or CMOS pixel array that is operable to sense light (e.g., IR, visible, or UV) of a particular wavelength or range of wavelengths. Further, each image sensor 32, which is an example of an active optoelectronic component, can be implemented as part of an integrated circuit (IC) formed, for example, as a semiconductor chip device that includes circuitry to perform processing (e.g., analog-to-digital processing) of signals produced by the light sensing elements. In some implementations, each of the sensors 32 is operable to sense light of the same wavelength or range of wavelengths, whereas in other implementations, the sensors 32 are operable to sense light at different wavelengths or ranges of wavelengths from one another. Using individual sensors 32, rather than a single large common sensor for all the channels, can provide greater flexibility in choosing sensors with specific characteristics tailored for each particular channel 22 or 24. Each sensor 32 can be mounted, for example, on a respective printed circuit board (PCB) 34. Wiring (i.e., electrically conductive connections) 36 can be provided from each sensor 32 to electrical contacts on the respective PCB 34. In some implementations, flip chip technology can be used to provide the electrical connections between the sensors 32 and the PCBs 34.

As further illustrated in the example of FIG. 1, the lens barrels 28 can be mounted directly or indirectly on a transparent cover 38 that is disposed between the lens stacks 26 and the sensors 32. The transparent cover 38 can be shaped, for example, as a plate whose thickness is substantially uniform. The cover 38, which can protect the sensors 32 from dirt and the like, is substantially transparent to the wavelength(s) of light detectable by the sensors 32. In some instances, the cover 38 is composed of a glass or plastic material. Providing a single transparent cover 38 over all the sensors 32 can help improve the mechanical stability of the module 20 and can help reduce the extent of thermal expansion in the module. In some instances, the lens stack-side of the cover 38, for example, can be partially coated with black chrome 40 to prevent stray light from being received by the sensors 32. The black chrome 40 can be deposited on the surface of the cover 38 other than on areas corresponding to the optical channels 22, 24.

Each of the sensors 32 for the various channels 22, 24 can be positioned at a different respective distance from the transparent cover 38 (and thus from the respective lens stack 26). Thus, in the illustrated example, the sensor 32 for the first channel 22 is closer to the transparent cover 38 than the sensor 32 for the second channel 24. To obtain this feature, a spacer 42 separates the transparent cover 38 from the sensors 32 and the PCBs 34. The upper surface of the spacer 42 can be in contact with the sensor-side of the transparent cover 38, and the lower surface(s) of the spacer can be in contact with the upper surfaces of the sensors 32 and the PCBs 34.

As illustrated in the example of FIG. 1, the height of the spacer 42 in an area defining one of the optical channels 22, 24 can differ from the height of the spacer in an area defining the other channel. Thus, in the illustrated example, the height of the spacer 42 is smaller for the first channel 22 than for the second channel 24. In particular, the distance from the sensor-side of the transparent cover 38 to the sensor 32 in the first channel 22 is h1, whereas the distance from the sensor-side of the transparent cover 38 to the sensor 32 in the second channel 24 is h2 (>h1). Likewise, the distance from the sensor-side of the transparent cover 38 to the PCB 34 in the first channel 22 is H1, whereas the distance from the sensor-side of the transparent cover 38 to the PCB 34 in the second channel 24 is H2 (>H1). The difference in the height of the spacer for the various channels 22, 24 can provide for focal length correction during manufacture and assembly of the imaging device. For example, if (during fabrication and assembly) the respective focal lengths of the channels 22, 24 differ from a nominal value, the height of the spacer 42 can be adjusted to correct for that difference. Thus, the actual focal length of each channel 22, 24 can substantially match a desired or specified value by placing the sensors 32 for the various channels 22, 24 at different respective distances from the transparent cover 38 (and thus from the respective lens stacks 26). Nevertheless, in some implementations, each of the sensors 32 may be at substantially the same distance from the transparent cover 38.

The spacer 42 also can include trenches 48 to provide space for the electrical connections 36 from the sensors 32 to the PCBs 34. The trenches 48 can be formed as annular spaces (e.g., ring or rectangular/square shaped) such that the electrical connections 36 can be provided along any part of the periphery of each respective sensor 32. FIGS. 1A, 1B and 1C show, respectively, a top cross-sectional view and side cross-sectional views of the spacer 42. The spacer 42 thus laterally surrounds the electrical connections 36, thereby providing a level of protection for them. The spacer 42 also laterally surrounds each of the image sensors 32 such that a portion of the spacer separates each image sensor 32 from an adjacent image sensor 32.

As further illustrated in the example of FIG. 1, the spacer 42 can be formed as a single monolithic piece and can be composed, for example, of a vacuum injection molded epoxy material that is substantially opaque for the wavelength(s) of light detectable by the sensors 32. In some cases, the lens barrels 28 are composed of the same material as the spacer 42. The spacer has openings (i.e., through-holes) 46 that serve as light conduits of the channels 22, 24 to allow light to pass from the lens stacks 26 through the transparent cover 38 and to the respective sensor 32. The sidewalls 42A and internal wall 42B of the spacer 42 that extend from the transparent cover 38 to the surface of the PCBs 34 laterally surround the sensors 32, thereby helping shield the sensors from stray light and from optical cross-talk.

In some implementations, optical filters can be provided, for example, on the transparent cover 38 or on the image sensors 32. Various types of optical filters can be used, such as monochromatic, Bayer or other color filter arrays, neutral density, or infra-red (IR). Depending on the implementation, the filters for each channel may be the same or may differ.

In some cases, the PCBs 34 are mounted on a common flexible cable (FPC) 44, which provides electrical connections to the sensors 32. The flexible cable 44 can conform to the different vertical positions of the PCBs 34.

Some implementations also include a protective hood 47 that surrounds the periphery 49 of the transparent cover 38. The hood 47 can help shield the module from stray light and can help conceal the transparent cover 38 from view. The hood 47 can include a top ledge 50 located over the top surface of the transparent cover 38 near its periphery. The hood 47, which can be formed, for example, of an injected molded epoxy material, should be substantially opaque to wavelength(s) of light detectable by the sensors 32. In some cases, the hood 47 is composed of the same material as the spacer 42. The top ledge 50 of the hood 47 can be attached to the outer sidewalls of the lens barrels 28 and can rest on the upper surface of the transparent cover 38.

Although the example of FIG. 1 illustrates a module 20 having two optical channels, some implementations may include only a single optical channel. Other implementations may include a M×N array of optical channels, wherein one or both of M and N are two or more.

Figure 2A:
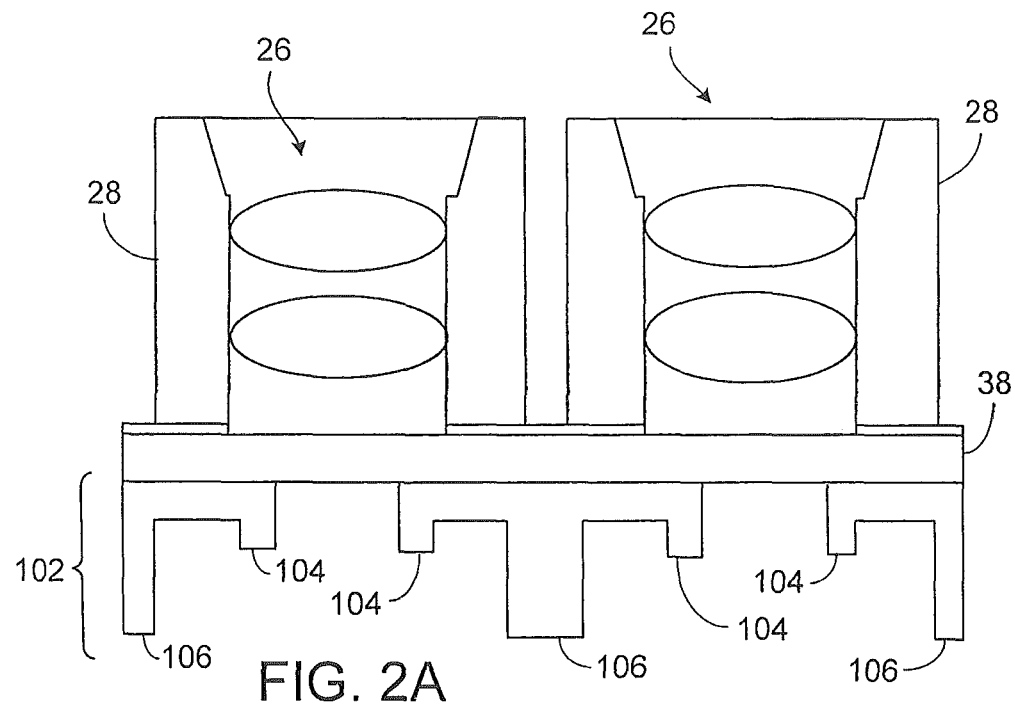
FIGS. 2A through 2D illustrate steps in accordance with a method of fabricating a module with a customized spacer.
Figure 2B:
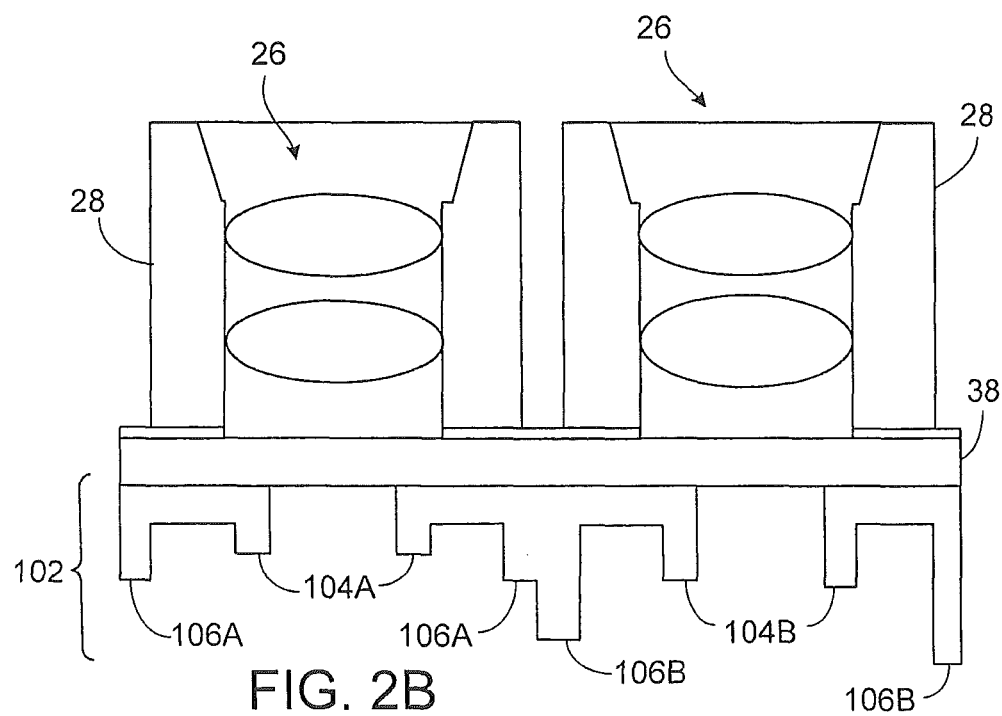

FIGS. 2A through 2D illustrate an example of fabricating portions of a module 20 having a customized spacer that provides channel focal length adjustment (e.g., focal length correction). As illustrated in FIG. 2A, beam shaping systems, such as lens barrels 28 holding respective lens stacks 26, are attached to a first surface of a transparent plate 38. An initial spacer 102 is attached to a second surface on the opposite side of the transparent plate 38. The initial spacer 102 can include openings 46 for the light conduit of each channel. The initial spacer 102 also can include a first set of extensions 104 to provide sensor-edge features for contact to image sensors and a second set of extensions 106 to provide PCB-edge features for attachment to PCBs on which the image sensors are mounted. The extensions 104, 106 extend in a direction away from the plate 38. The initial spacer 102 can be formed, for example, by a vacuum injection molding and/or micromachining processes.

Figure 2C:
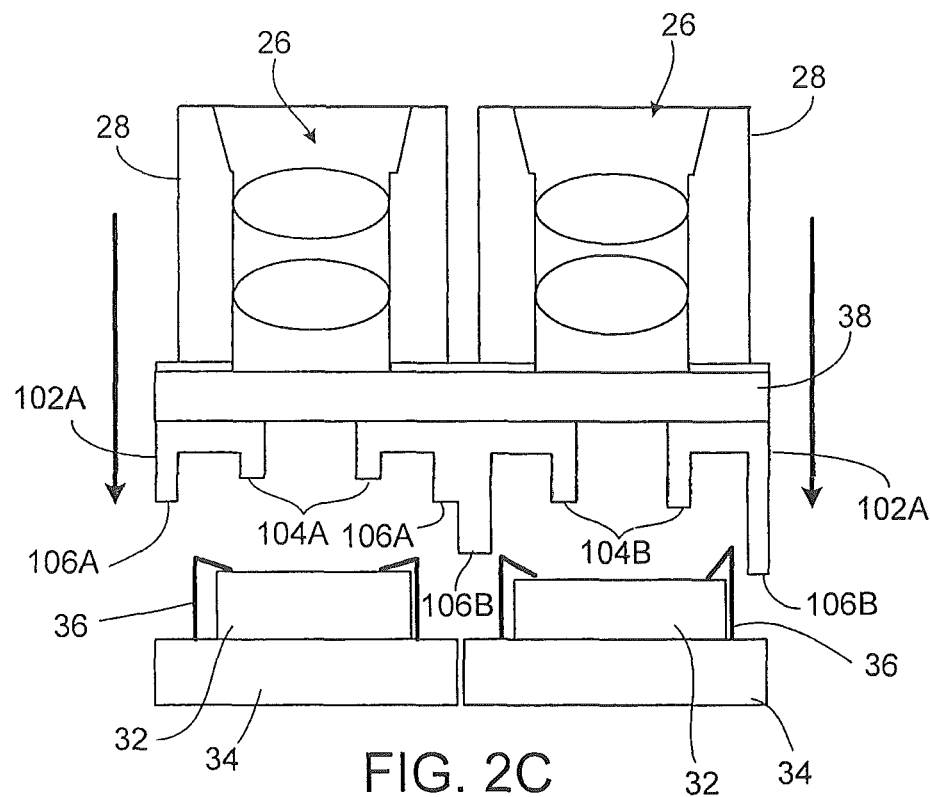
Figure 3:
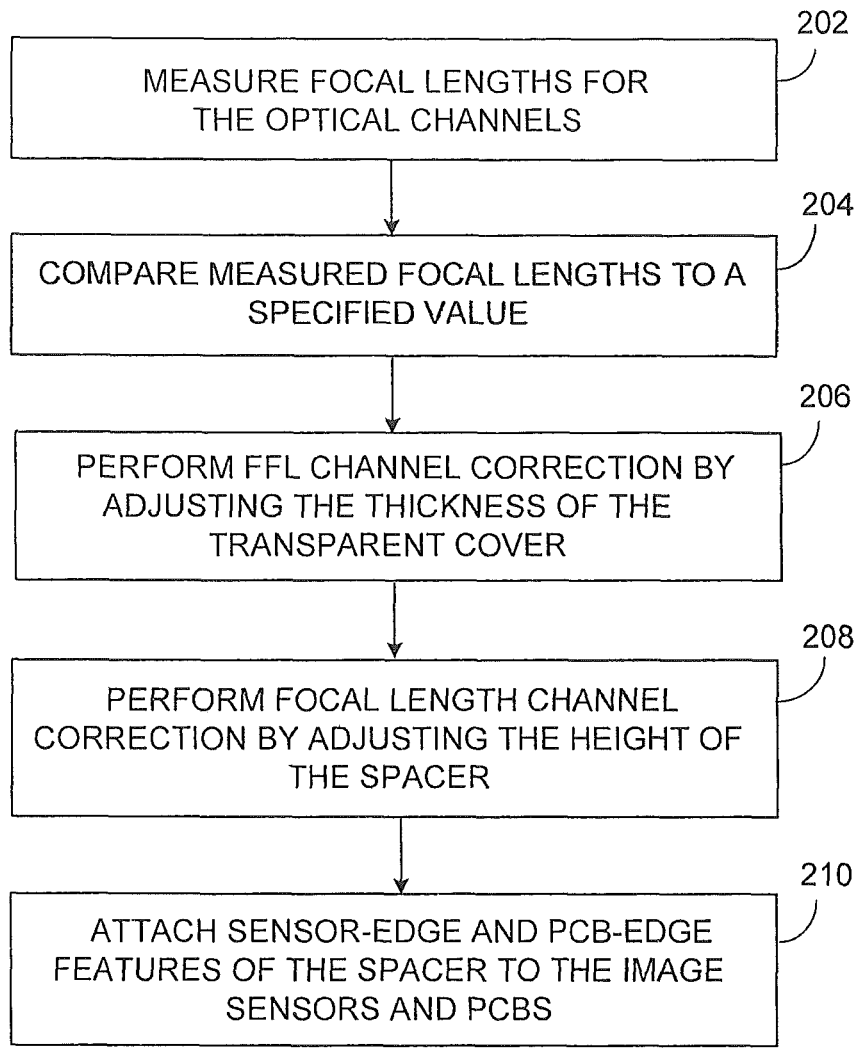
FIG. 3 is a flow chart of a fabrication technique for making a module with a customized spacer.

Before attaching the image sensor/PCB pairs to the spacer 42, a focal length (e.g., FFL) measurement is made for each optical channel (FIG. 3, block 202). The measured focal lengths then can be compared to a specified (e.g., nominal) focal length value (block 204). If the measured value for a particular optical channel differs from the specified value, various adjustments can be made. In some cases, adjustments can be made to provide for FFL channel correction (block 206). This can be accomplished, for example, by applying (e.g., by photolithography) one or more layers of optically transparent material to the underside of the transparent cover 38. The thickness of the layer(s) provided for each optical channel may differ depending on the amount of correction needed for each channel. Further, the height of the spacer extensions 104, 106 for the particular channel can be adjusted to achieve a corrected focal length of the channel that substantially matches the desired value (block 208). For example, the height of some or all of the extensions 104, 106 can be reduced by micromachining. The height of the extensions 104, 106 for different channels may be reduced by the same amount or different amounts, depending on the amount of focal length correction to be made for each channel. No adjustment may be needed for a particular channel if the focal length of the channel already is satisfactory (i.e., within a specified tolerance of the nominal value). The result is a customized spacer 102A (see FIGS. 2B and 2C) which provides focal length adjustment (e.g., correction) and has sensor-edge features 104A, 104B for contact with the upper surface of the respective image sensors 32 and PCB-edge features 106A, 106B for attachment to the upper surface of the respective PCBs 34. FIG. 2C shows an example in which the heights of the extensions 104A, 106A for the optical channel on the left-hand side were adjusted, whereas the heights of the extensions 104B, 106B for the optical channel on the right-hand side were not adjusted. In the resulting customized spacer 102A, the vertical position (i.e., the height) of the sensor-edge feature 104A for one channel may differ from the vertical position of the sensor-edge feature 104B of another channel. Likewise, the vertical position (i.e., the height) of the corresponding PCB-edge feature 106A for one channel may differ from the vertical position of the PCB-edge feature 106B of another channel. In some cases, the focal lengths for the channels subsequently may be re-measured to confirm whether additional micromachining of the extensions 104, 106 is needed. In some implementations, both steps 206 and 208 are performed; in other cases, only one of the steps 206, 208 may be performed, and the other may be omitted.

Figure 2D:
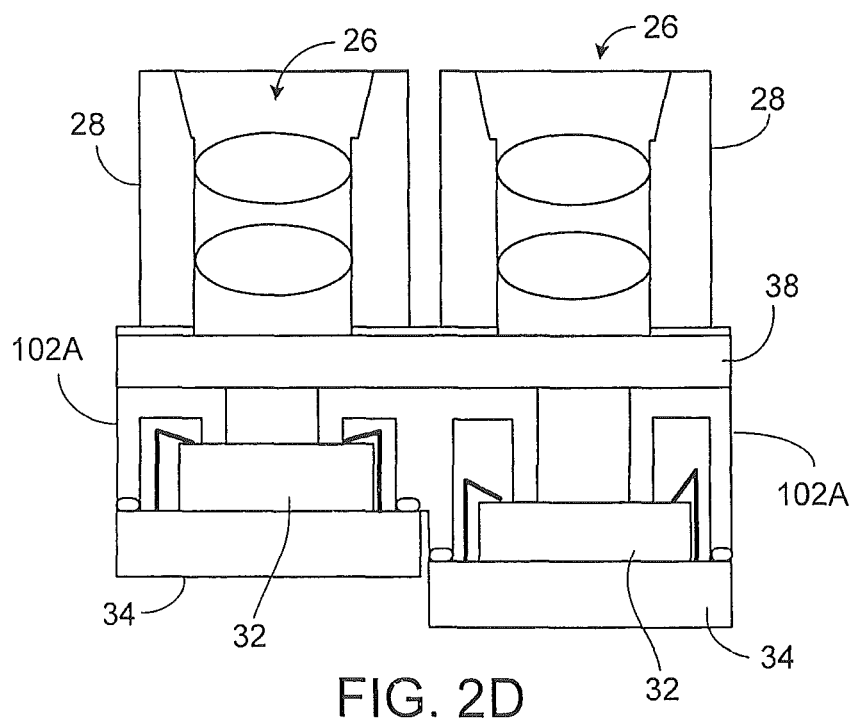

After making any necessary or desired adjustments to the spacer, the sensor-edge features 104A, 104B of the spacer 102A can be brought into contact with respective image sensors 32 and the PCB-edge features 106A, 106B of the spacer 102A can be attached (directly or indirectly) to the respective PCBs 34 on which the image sensors 32 are mounted (FIG. 3, block 210; see FIGS. 2C and 2D). In some cases, the upper surface of each PCB 34 is attached directly, for example, by an adhesive to a respective PCB-edge feature 106A, 106B. The wiring 36 connecting the sensors 32 to the PCBs 34 should be provided prior to attaching the sensor/PCB pairs to the spacer 102A. After attaching the spacer 102A to the image sensors/PCB pairs, a protective hood 47 and flexible cable 44 can be provided (see FIG. 1).

Figure 4A:
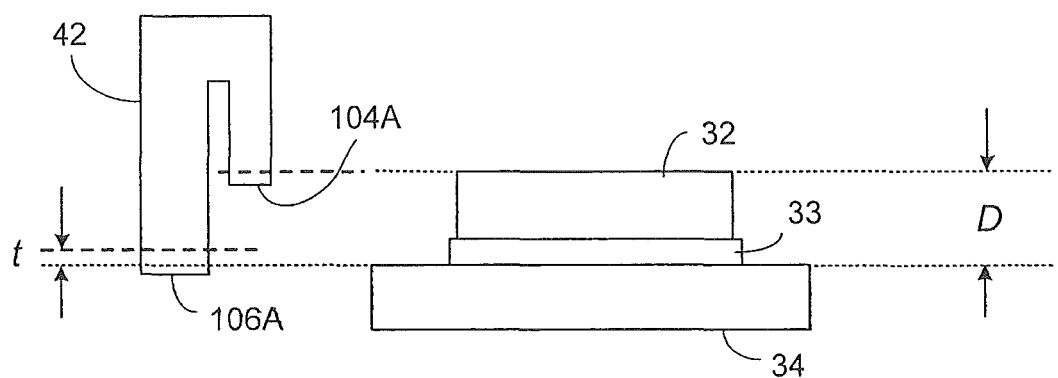
FIGS. 4A and 4B illustrate further details of a customized spacer.
Figure 4B:
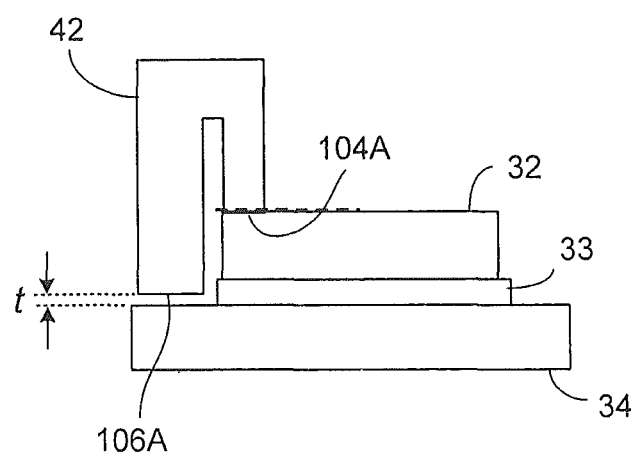

In some implementations, the height of the image sensors 32 may vary slightly from a nominal value or may vary with respect to one another. Likewise, the thickness of glue or other adhesive 33 that is used to attach the images sensors 32 to the respective PCBs 34 may vary from a nominal value or may vary from one sensor/PCB pair to another. Thus, variations in the sensor-to-PCB thickness (D) may occur. See FIG. 4A. To reduce the extent of any such variations, the height of the extension 106 for a particular PCB-edge feature 106A should be such that, when the corresponding sensor-edge feature 104A of the spacer is brought into contact with the upper surface of the image sensor 32, there is a small space (of thickness (t)) between the PCB-edge feature 106A and the surface of the PCB 34. In some cases, it may be necessary to reduce the height of the extension 106, for example, by micromachining, prior to bringing the spacer into contact with the image sensor 32. The space between the spacer's PCB-edge feature 106A and the PCB 34 then can be filled with an adhesive so that the PCB-edge feature 106A rests indirectly on the PCB 34. Thus, in this case, the PCB-edge feature 106A is attached indirectly to the PCB 34. In this way, the focal length adjustment (e.g., correction) for a given channel need not be impacted significantly by any variations in the sensor-to-PCB thickness (D). See FIG. 4B. In particular, the foregoing techniques can accommodate for differences in the sensor-to-PCB thickness (D).

In some implementations, multiple modules like the module 20 can be made by a wafer-level process. Wafer-level processes allow multiple modules 20 to be fabricated at the same time. Generally, a wafer refers to a substantially disk- or plate-like shaped item, its extension in one direction (z-direction or vertical direction) is small with respect to its extension in the other two directions (x- and y-, or lateral, directions). In some implementations, the diameter of the wafer is between 5 cm and 40 cm, and can be, for example, between 10 cm and 31 cm. The wafer may be cylindrical with a diameter, for example, of 2, 4, 6, 8, or 12 inches, one inch being about 2.54 cm. In some implementations of a wafer level process, there can be provisions for at least ten modules in each lateral direction, and in some cases at least thirty or even fifty or more modules in each lateral direction.

As an example of a wafer-level process, multiple beam shaping systems can be arranged on one surface of a transparent wafer, and spacer portions can be provided on the sensor side of the transparent wafer. The transparent wafer can be composed, for example, of glass or plastic. The spacer portions can be provided, for example, by vacuum injection molding, or as a spacer wafer that is attached to the sensor-side of the transparent wafer. The spacer wafer can be composed, for example, of a non-transparent material, such as a vacuum injected polymer material (e.g., epoxy, acrylate, polyurethane, or silicone) containing a non-transparent filler (e.g., carbon black, pigment, or dye). After measuring the focal length (e.g., FFL) for each optical channel, the height of the spacer can be adjusted, for example, by micromachining, to provide for focal length correction of one or more of the channels. The image sensors then can be brought into contact with the spacer portions, and the stack can be separated (e.g., by dicing) into multiple individual modules 20. In some cases, the dicing may be performed prior to bringing the image sensors 32 into contact with the spacer portions. Further, in some cases, the dicing may be performed even before micromachining the spacer portions to provide for focal length correction.

Figure 5:
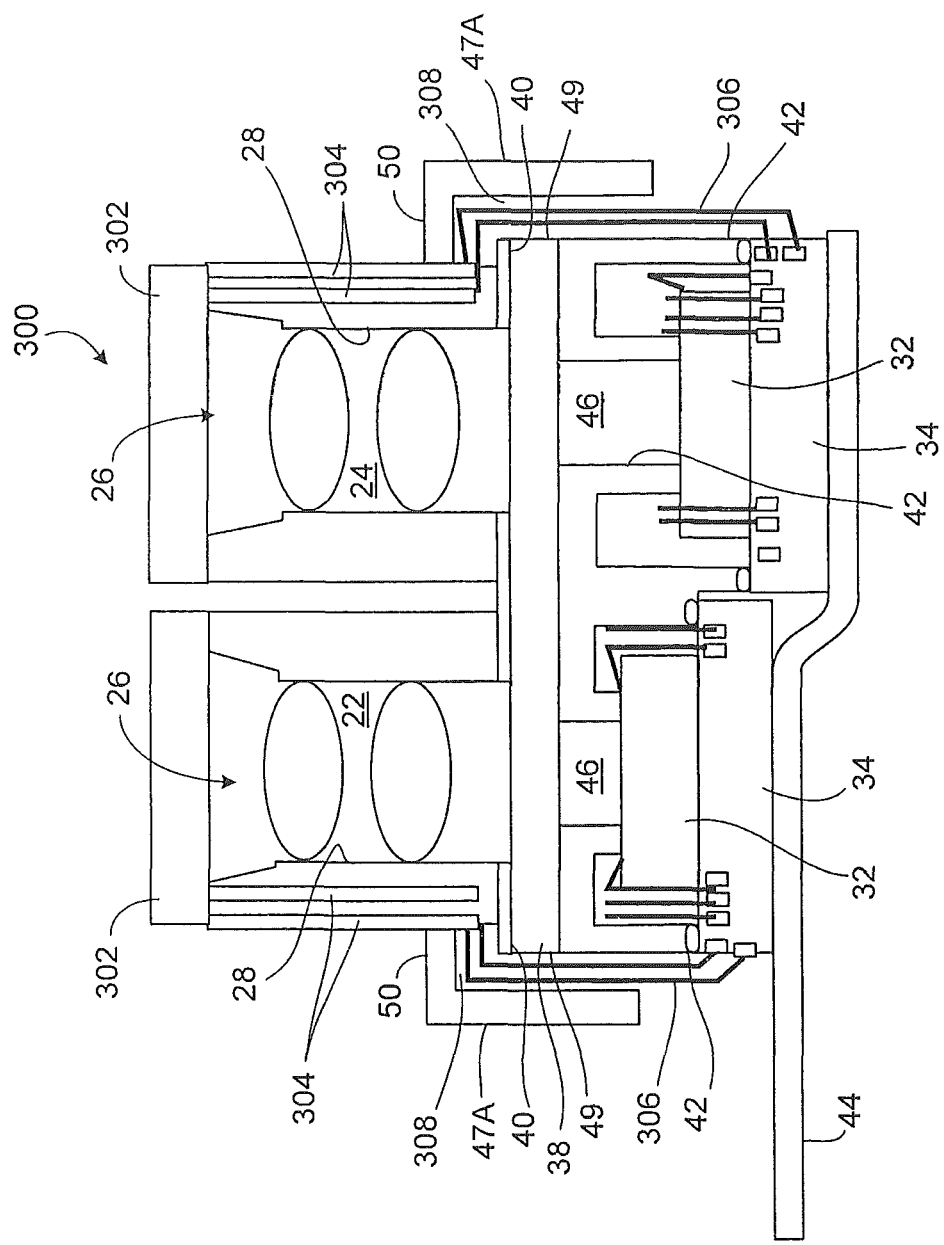
FIG. 5 illustrates another example of a multi-channel module having a customized spacer.

In some implementations, other features can be included, such as an auto-focus feature. FIG. 5 illustrates an example of such an implementation. The module 300 of FIG. 5 is similar to the module 20 of FIG. 1, but also includes auto-focus components 302 each of which is associated with a respective one of the optical channels 22, 24. The auto-focus components 302 can be disposed over the respective lens stack 26 and can include, for example, a dynamic lens with electrical connections to the PCB 34. In some implementations, the auto-focus components include a lens that can be moved vertically within the optical channel to modify the optical characteristics for the channel. The electrical connections from the auto-focus component 302 to the PCB 34 can include, for example, an electrically conductive coating 304 along the outer sides of the lens barrels 28. The electrically conductive coating 304 can be formed, for example, as copper traces along the outer surfaces of the lens barrels 28. The conductive coating 304 can be coupled directly to the auto-focus component 302 and to wiring 306, which in turn is coupled to a respective one of the PCBs 34. Signals from the PCBs 34 thus can be provided to the auto-focus components 302 to control and adjust their optical characteristics.

Figures 6A, 6B, 6C:
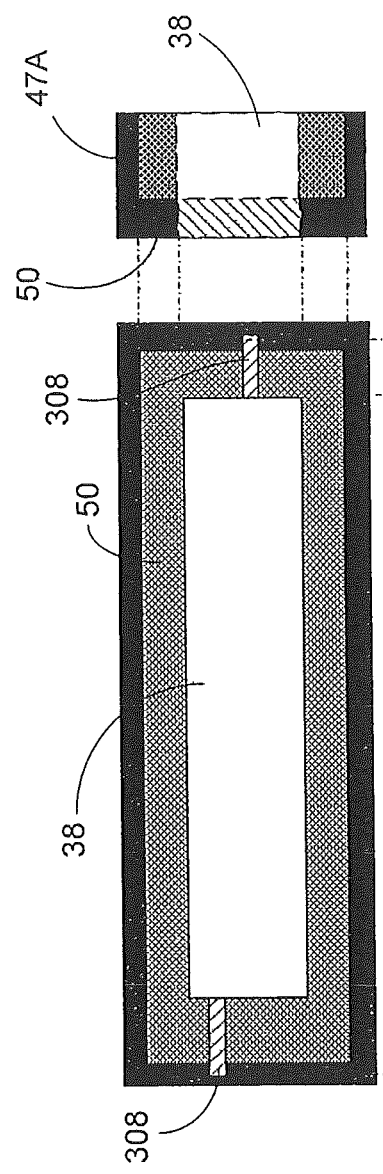
FIGS. 6A, 6B and 6C illustrate, respectively, a top cross-sectional view and side cross-sectional views of a protective hood for the implementation of FIG. 4.

As shown in FIG. 5, a protective hood 47A surrounds the periphery 49 of the transparent cover 38 and also can help shield the module from stray light and can help conceal the transparent cover 38 from view. The hood 47A can include a top ledge 50 located over the top surface of the transparent cover 38 near its periphery. In addition, the hood 47A can provide channels 308 for the wiring 306. FIGS. 6A, 6B and 6C illustrate, respectively, a cross-sectional top view and cross-sectional side views of the hood 47A.

As described above, customized spacers that include sensor-edge features for contact with the upper surface of the respective image sensors, and that include PCB-edge features for attachment to the upper surface of the respective PCBs, can facilitate focal length adjustment (e.g., FFL correction). Customized spacers also can be used to address other issues that may arise during fabrication of modules that incorporate an active optoelectronic component (e.g., an image sensor). The following paragraphs describe examples of modules including a customized spacer that can help address such other problems that sometimes arise during fabrication.

Tilt, for example, can be introduced as a result of the uneven distribution of adhesive used to attach a beam shaping system (e.g., a lens barrel and optical assembly) to a transparent wafer, or as a result of the uneven distribution of adhesive used to attach an optical assembly to an image sensor or PCB substrate. The tilt can cause poor image quality. Further, if the adhesive is not controlled properly, it may migrate to an active portion of the image sensor, and render the sensor unusable. Customized spacers can be used to help reduce the occurrence of tilt of components in the module, and/or to help prevent adhesive from migrating to active portions of the image sensor.

As shown in FIG. 7A, a beam shaping system 425 (e.g., optics assembly 426 and lens barrel 428) is at one side (i.e., the object-side) of a transparent plate 438, and a spacer 402 is at the second side (i.e., the sensor-side) of the transparent plate 438. The lens barrel 428 can be attached to the spacer 402 by adhesive or may be formed as a unitary piece with the spacer 402. In some instances, an optical element such as an optical filter 440 may be present on the transparent plate 438. As illustrated in FIG. 7A, the spacer 402 includes a through-hole substantially aligned with the beam shaping system and corresponding to an optical channel. The spacer 402 further includes a first extension that provides a sensor alignment edge 404, and a second extension that provides a PCB adhesion edge 406. The sensor alignment edge 404 defines the distance from the upper surface of the image sensor 432 to the optical assembly 426 (see FIG. 7B). The PCB adhesion edge 406 provides the bond line (i.e., the location where adhesive is placed for attachment to the PCB 434).

The sensor alignment edge 404 can be customized (e.g., machined) such that the focal length and any tilt are corrected. As shown in FIG. 7B, the alignment edge 404 is placed in direct contact with an inactive portion of the image sensor 432 (e.g., near the periphery of the sensor 432). Preferably, no adhesive is used between the alignment edge 404 and the surface of the sensor 432. The PCB adhesion edge 406 also can be customized (e.g., machined) such that it is allows the alignment edge 404 to make contact with the upper surface of the image sensor 432, and also allows for an adhesive (e.g., at a thickness of approximately 20 µm±5 to 10 µm) to be present between the adhesion edge 406 and the upper surface of the PCB 434 (see FIG. 7B).

The customized spacer 402 can provide various advantages in some implementations. For example, the adhesive 410 can be kept away more easily from the image sensor 432. Further, the wires 412 connecting the sensor 432 to the PCB 434 can be better protected because they are disposed within a cavity 411 between the alignment and adhesion edges 404, 406. Also, better control of the height/tilt can be achieved in some cases because the adhesive is on the PCB adhesion edge 406, not the sensor alignment edge 404.

Figure 8A:
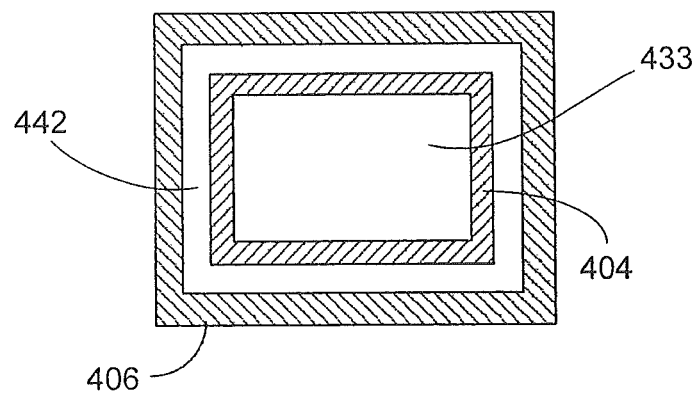
FIGS. 8A and 8B illustrate plan views of examples of customizable spacers.
Figure 8B:
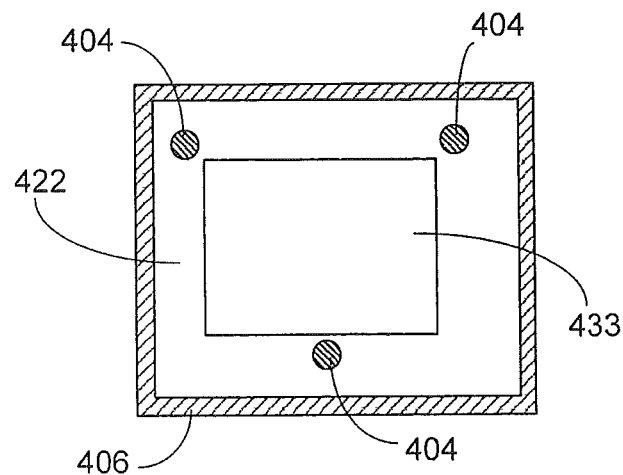

The alignment edge 404 can take any one of various forms. For example, as shown in FIG. 8A, the sensor alignment edge 404 laterally can surround the entire periphery of the active (i.e., photosensitive) portion 433 of the image sensor 432. In other implementations, the sensor alignment edge 404 can be implemented as a plurality of individual pillars (see FIG. 8B). Preferably, there are at least three such pillars to provide mechanical stability.

Figure 9:
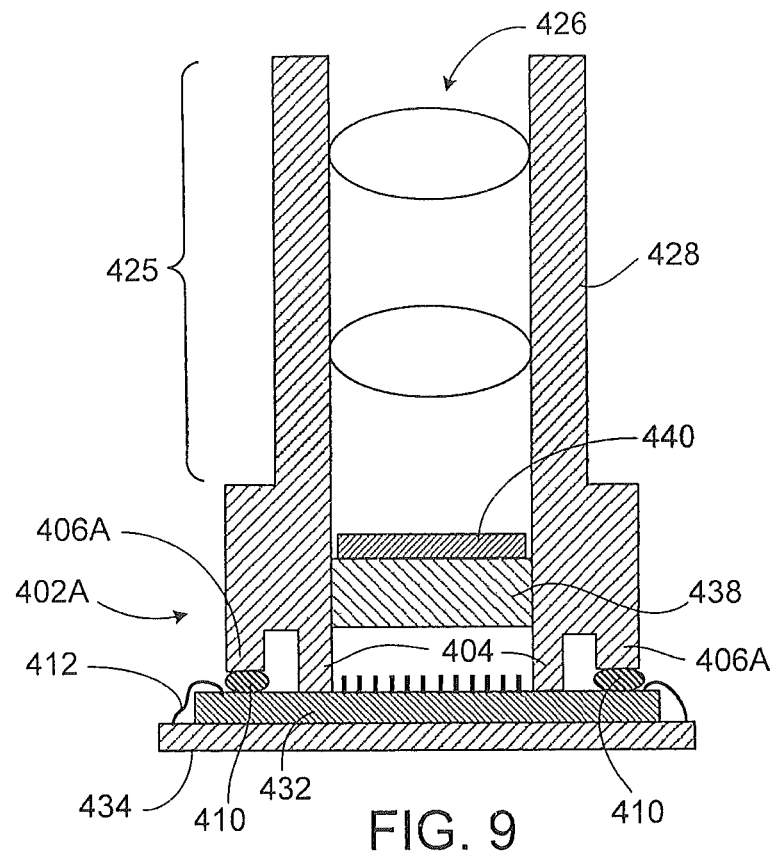
FIGS. 9 and 9A illustrate another example of a customizable spacer for a single channel module.
Figure 9A:
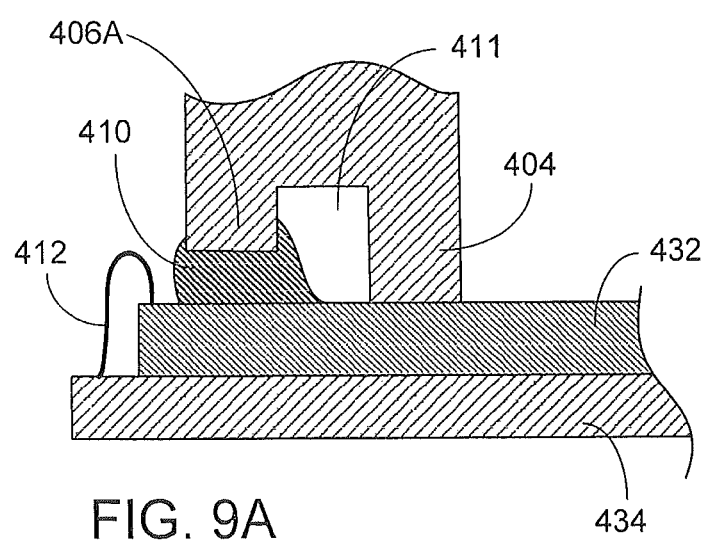

In some implementations, the inactive area of the image sensor 432 may be sufficiently large as to be capable of accommodating both an adhesion edge 406A as well as an alignment edge 404 (see FIG. 9). In that case, the adhesion edge 406A can be attached (e.g., by adhesive) to the inactive area of the sensor 432; likewise, the alignment edge 404 can be placed in direct contact with the inactive area of the sensor 432 (i.e., without adhesive). Prior to attaching the spacer 402A to the image sensor 432, one or both of the alignment and adhesion edges 404, 406A can be machined to the desired dimensions. As shown in the magnified, cut-away view of FIG. 9A, the cavity 411 between the edges 404, 406A can be designed so that capillary forces wick away the adhesive (e.g., epoxy) such that it does not reach the sensor alignment edge 404 and the active area of the image sensor 432. In some cases, the conductive wires 412 connecting the sensor 432 to the PCB 434 can be encapsulated (e.g., with back-fill epoxy) to enhance their mechanical stability. The presence of the adhesive 410 reduces the risk that the encapsulant covering the wires 412 will contaminate the image sensor 432.

Figure 10A:
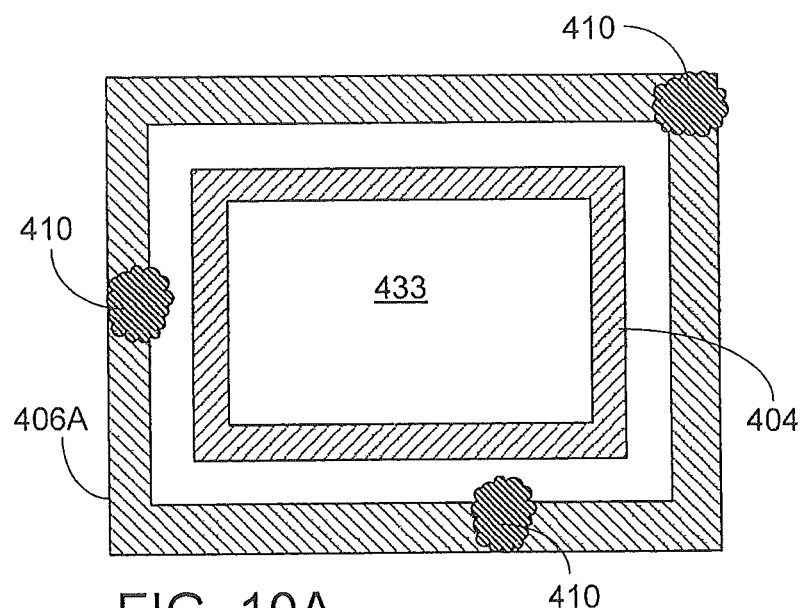
FIGS. 10A and 10B illustrate plan views of further examples of customizable spacers.
Figure 10B:
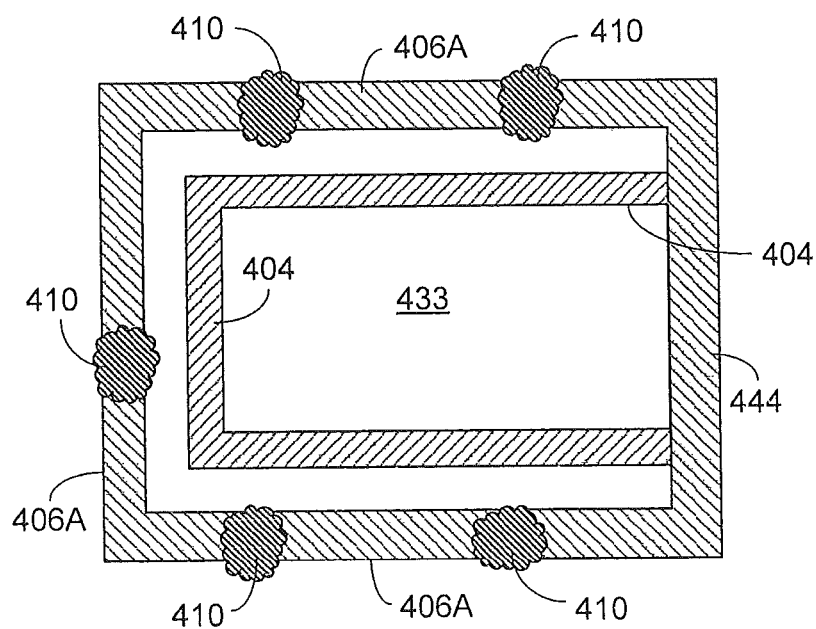

In some implementations, the adhesive 410 may be present along substantially the entire contact surface of the adhesive edge 406A. In other cases, the adhesive may be present only on parts of the edge 406, 406A. For example, individual beads of adhesive 410 may be provided on portions of the edge's contact surface (see FIG. 10A). To reduce the overall footprint of the spacer 402, 402A, the sensor alignment edge 404 and the sensor adhesive edge 406A can share a side 444 in common (see FIG. 10B). In that case, adhesive 410 can be placed along the other sides of the sensor adhesive edge 406, 406A, but would not be placed along the side 444 shared in common with the sensor alignment edge.

In the foregoing implementations, the optics assembly 426 can include, for example, a stack of lenses that provides a single optical channel, or a stack of lens arrays that provides two or more optical channels. In the case of lens arrays, some of the arrays may be implemented as laterally contiguous monolithic arrays that span across multiple channels.

Figure 11A:
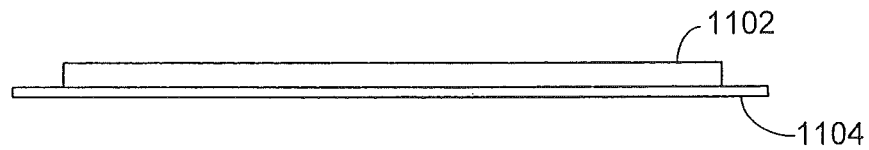
FIGS. 11A-11N illustrate steps in a wafer-level fabrication process for making multiple modules.
Figure 11B:
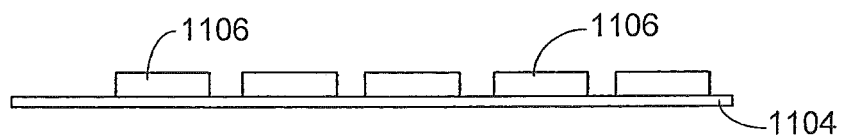
Figure 11C:
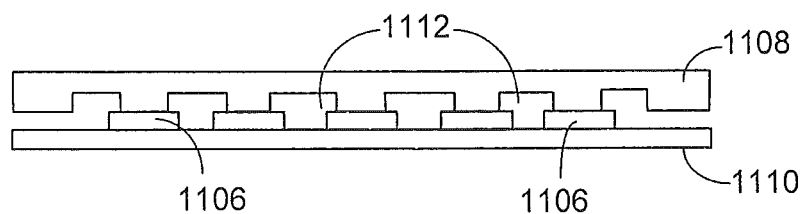
Figure 11D:
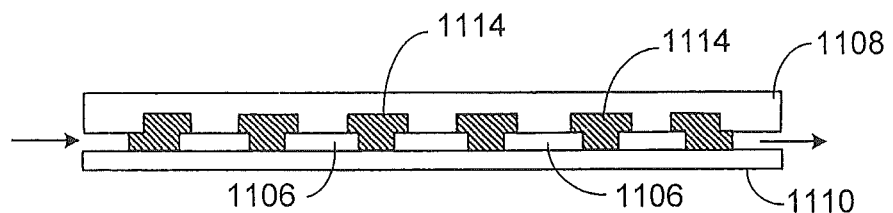
Figure 11E:
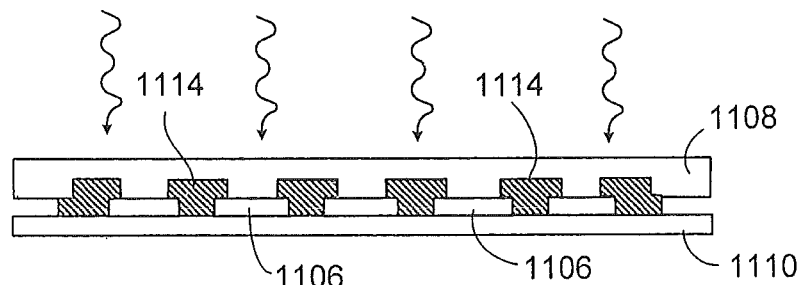
Figure 11F:
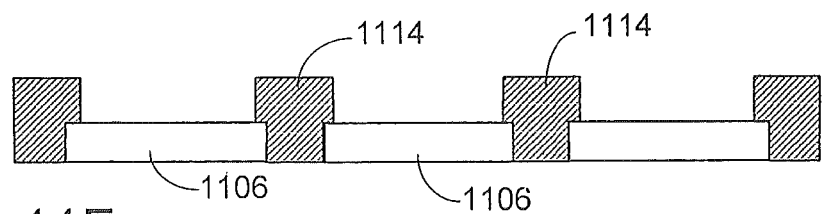
Figure 11G:
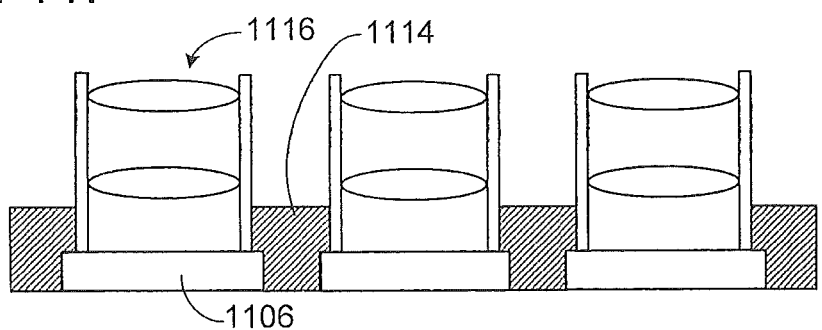
Figure 11H:
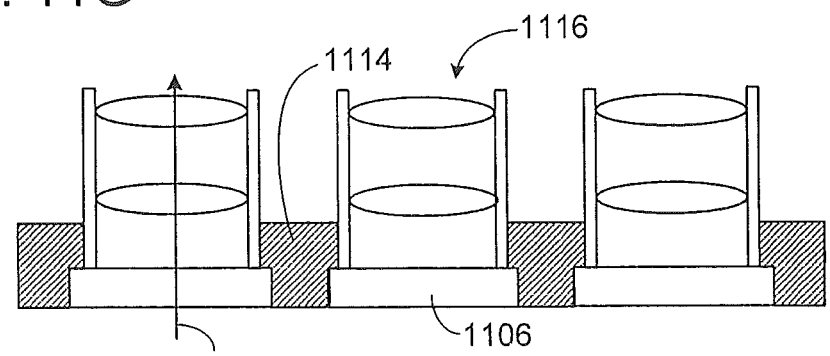
Figure 11I:
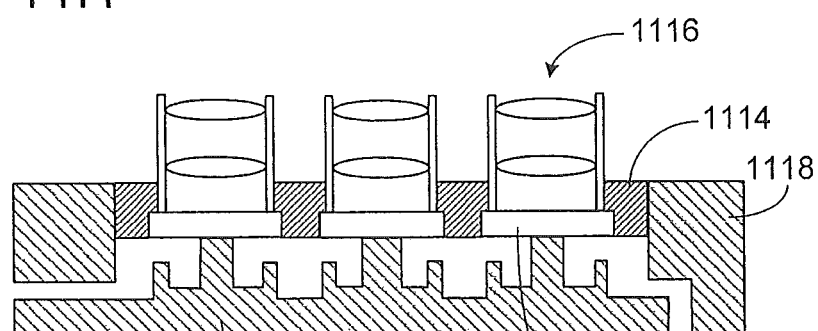
Figure 11J:
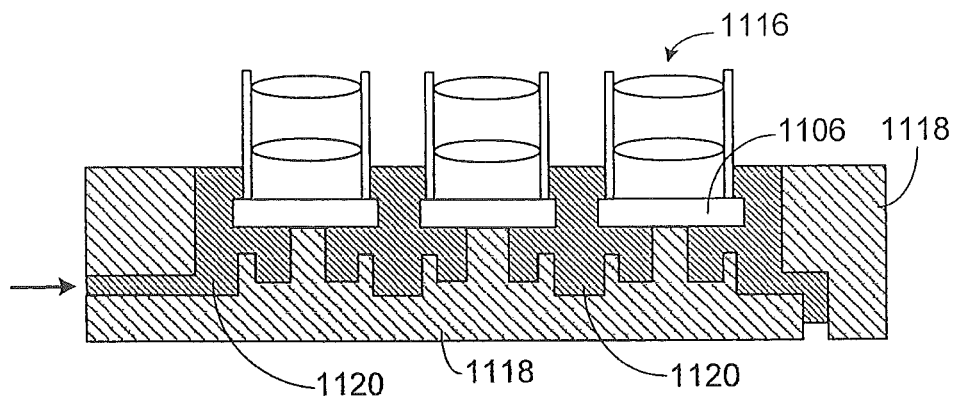
Figure 11K:
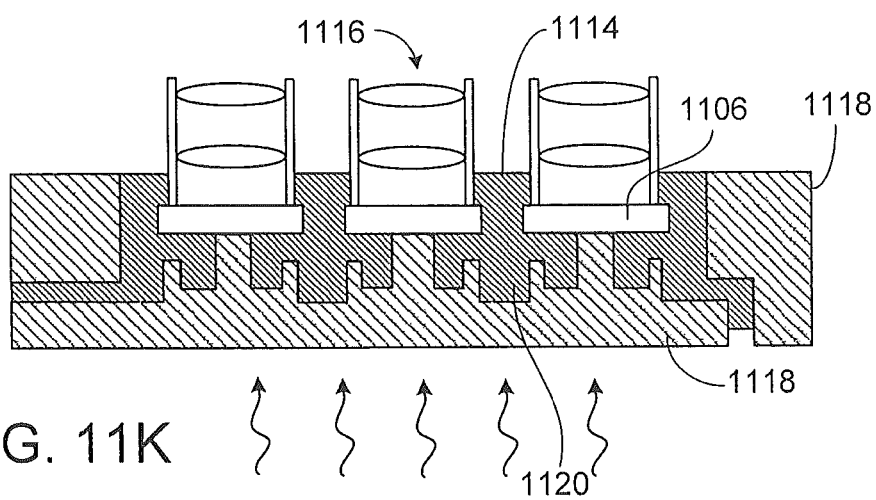
Figure 11L:
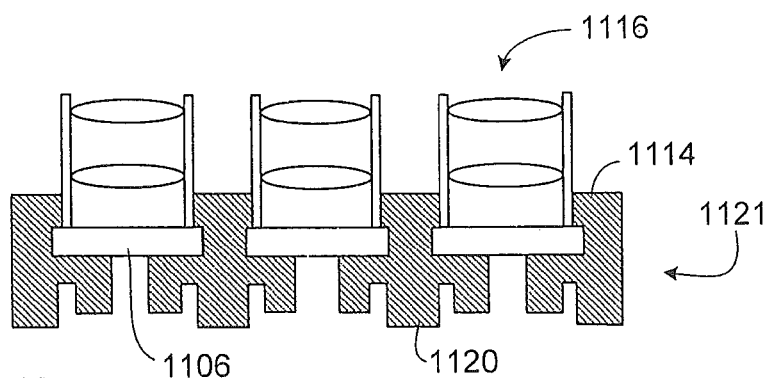
Figure 11M:
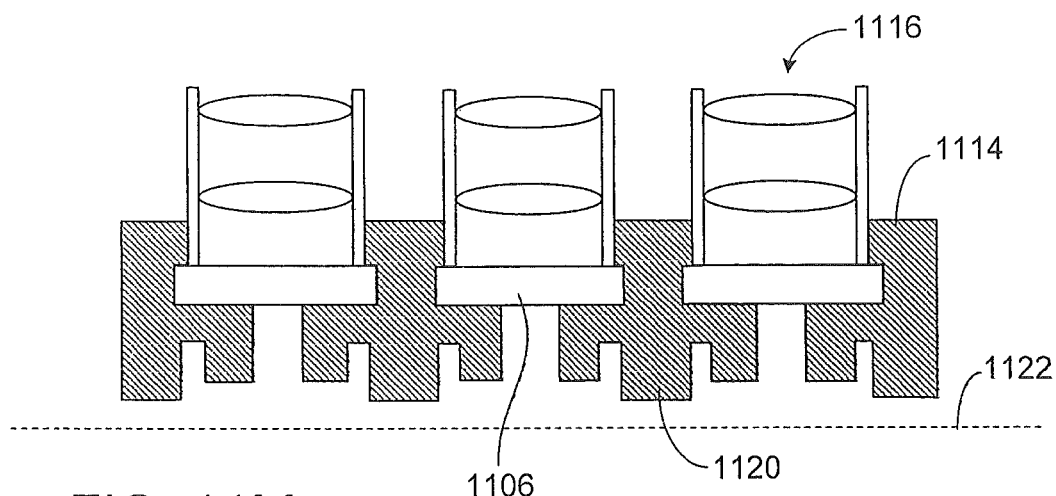
Figure 11N:
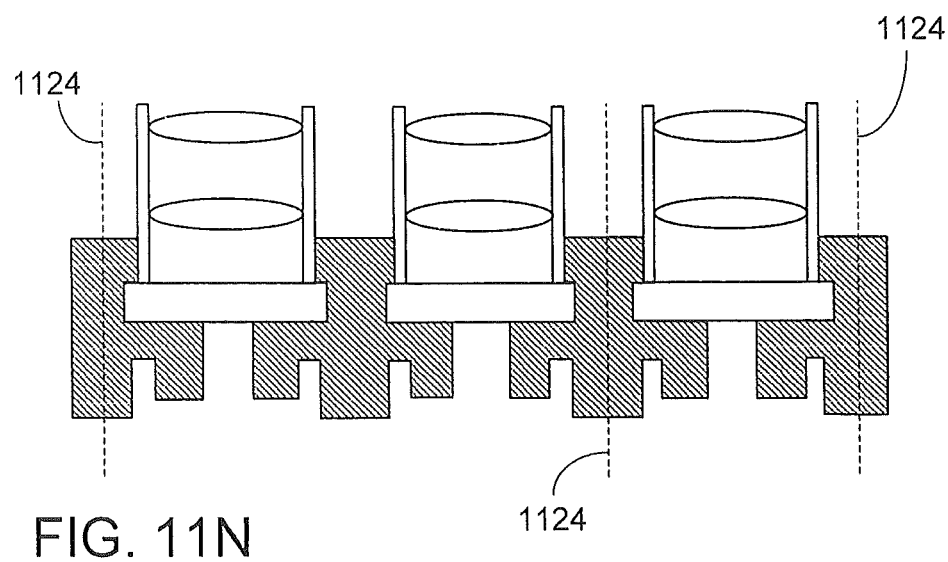

FIGS. 11A-11N illustrate an example of a wafer-level process for fabricating assemblies that include customized spacers having an adhesion edge and an alignment edge. As shown in FIG. 11A, a transparent wafer 1102 (e.g., composed of glass or plastic) is attached to UV dicing tape 1104. In some cases, the wafer 1102 may be pre-coated with an optical filter or other layer. The transparent wafer 1102 is separated, for example by dicing, into individual transparent covers 1106, as shown in FIG. 11B. Next, as illustrated by FIG. 11C, vacuum injection tools 1108, 1110 are provided such that the lower tool 1110 is flush with the bottom of the transparent covers 1106, and the upper tool 1108 has cavities 1112 that define the spacer regions. Then, as shown in FIG. 11D, a non-transparent material, such as a polymer material (e.g., epoxy, acrylate, polyurethane, or silicone) containing a non-transparent filler (e.g., carbon black, pigment, or dye), is injected under vacuum into the regions between the tools 1108, 1110. Subsequently, the non-transparent material 1114 that fills the cavities 1112 is cured, for example, using UV radiation (FIG. 11E). The tools 1108, 1110 then are removed from the resulting structure 1115 (see FIG. 11F).

Next, as shown in FIG. 11G, a respective beam shaping system 1116 is attached, for example by adhesive, to each transparent cover 1106 or to the upper surface of the non-transparent material 1114. Each beam shaping system 1116 can include, for example, a lens stack and lens barrel. Alternatively, a beam shaping system for the optical channels may be provided in the form of a lens wafer (e.g., a non-transparent substrate with an array of through holes filled with transparent material forming optical elements), or by lens elements individually placed or replicated directly onto a cover glass. Various measurements can be made for each optical channel, including the channel's modulation transfer function (MTF), the channels' focal length and/or the amount of tilt with respect to a reference plane. As illustrated by FIG. 11H, the measurements may involve generating one or more optical signals 1117 that pass through the optical channel, and measuring one or more parameters of the signal(s). In some implementations, the optical measurements are performed at a later stage in the process (e.g., just prior to the machining depicted in FIG. 11M). The measurements can be used in subsequent processing steps to machine the spacer. Regardless of whether the optical measurements are performed immediately following the step of FIG. 11G or at a later stage, another vacuum injection tool 1118 is provided (see FIG. 11I), and non-transparent material 1120 is injected under vacuum for the alignment and adhesion edges of each channel (see FIG. 11J). Here too, the non-transparent material can be a polymer material (e.g., epoxy, acrylate, polyurethane, or silicone) containing a non-transparent filler (e.g., carbon black, pigment, or dye). The non-transparent material is cured using, for example, UV radiation (FIG. 11K), and the resulting structure 1121 is removed from the tool 1118 (FIG. 11L). As indicated by FIG. 11M, the alignment and adhesion edges then can be micro-machined, as needed, based on the distance from a reference plane 1122 and the previously-made optical measurements. As shown in FIG. 11N, the resulting structure then can be separated (e.g., by dicing) along vertical lines 1124 into individual modules or arrays of modules, each of which includes a customized spacer having alignment and adhesion edges as described above. Each diced module then can be placed, for example, on an individual image sensor substrate structure.

In some cases, prior to dicing, the module wafer resulting from the completion of the steps depicted in FIG. 11M may be attached (e.g., by adhesive) to a substrate wafer (e.g., a PCB wafer) on which are mounted an array of sensors. The resulting structure then can be diced into individual modules or arrays of modules.

In the foregoing examples, the adhesive (e.g., 410) for attaching the optical assembly to the PCB (e.g., 434) is disposed primarily between adhesion edges (e.g., 406) on a sensor-side of the spacer (e.g., 402) and an upper surface of the PCB 434. In some implementations, however, the adhesion edges can be provided at side surfaces laterally encircling the side edges of the transparent plate/cover 438. Examples are illustrated in FIGS. 12A and 12B.

Figure 12A:
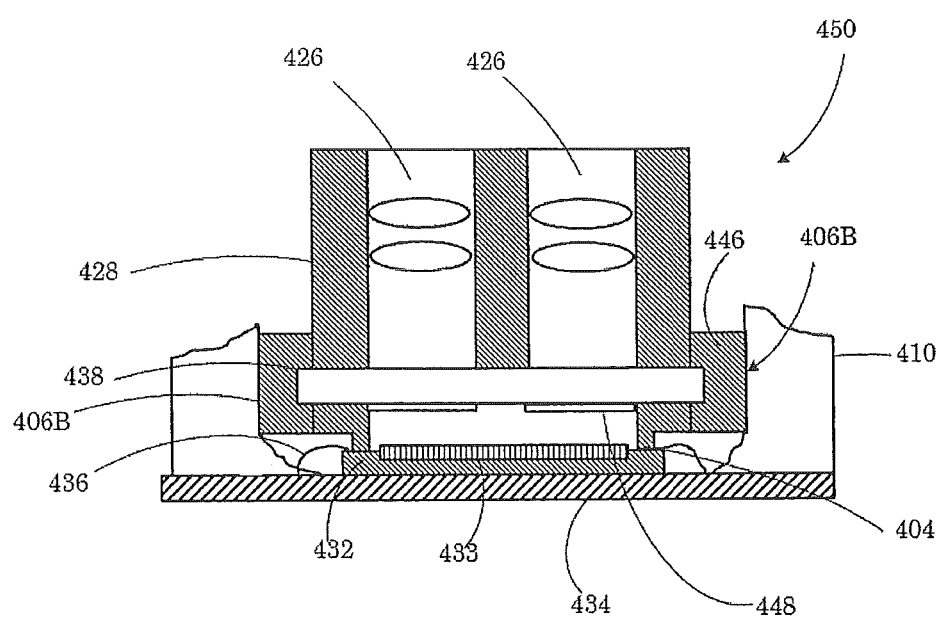
FIG. 12A illustrates a further example of a multi-channel module.

As shown, for example, in FIG. 12A, a multi-channel module includes a transparent cover 438 laterally surrounded by material 446 that is substantially opaque for the wavelength(s) of light detectable by the active region 433 of the image sensor 432. The material 446 can be composed, for example, of a vacuum injection molded epoxy and can help prevent stray light from impinging on the active regions of the sensor 432. In some cases, the material 446 laterally surrounding the cover 438 is the same as the material forming the spacer 402 (including the alignment edges 404) and/or the lens barrels 428. As further illustrated in the example of FIG. 12A, the transparent cover 438 may be embedded within the surrounding material 446. As described in connection with the example of FIG. 7B, the sensor alignment edges 404 can be in direct contact with the non-active regions of the sensor 432 and establish a predetermined fixed distance between the sensor 432 and the transparent cover 438. Adhesion edges 406B can be provided at the outer side surfaces of the vacuum injection molded epoxy material 446 encircling the transparent cover 438. The outer side surface defining the adhesion edge(s) 406B can be substantially perpendicular to the surface of the substrate 434. As shown in FIG. 12A, adhesive 410 holds the optics assembly in place over the sensor 432. In this case, the adhesive, which can be a high viscosity material, is in contact with the adhesion edges 406B as well as the sensor-side surface of the PCB 434. The example of FIG. 12A also includes FFL correction layers 448, which can be used during fabrication of the modules to adjust the focal lengths of the channels.

Figure 12B:
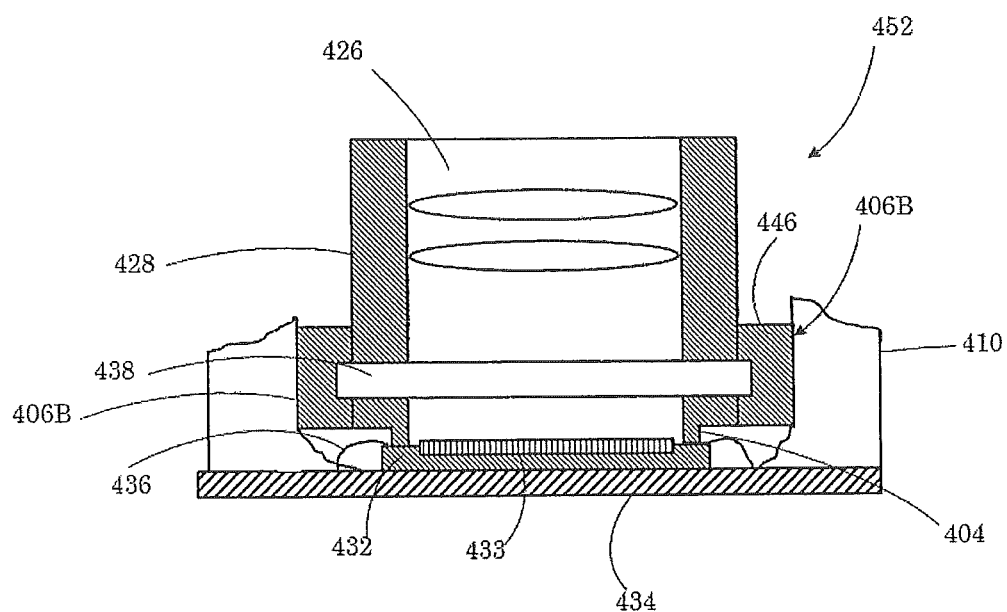
FIG. 12B illustrates a further example of a single channel module.

FIG. 12B illustrates an example of a single channel module, which also has adhesion edges 406B similar to those described in connection with FIG. 12A.

In many cases, for the implementations of FIGS. 12A and 12B, it is not necessary to machine the PCB adhesion edges 406B. Thus, in some cases, the process for fabricating modules using the arrangement of FIGS. 12A, 12B can be simplified.

Figure 13:
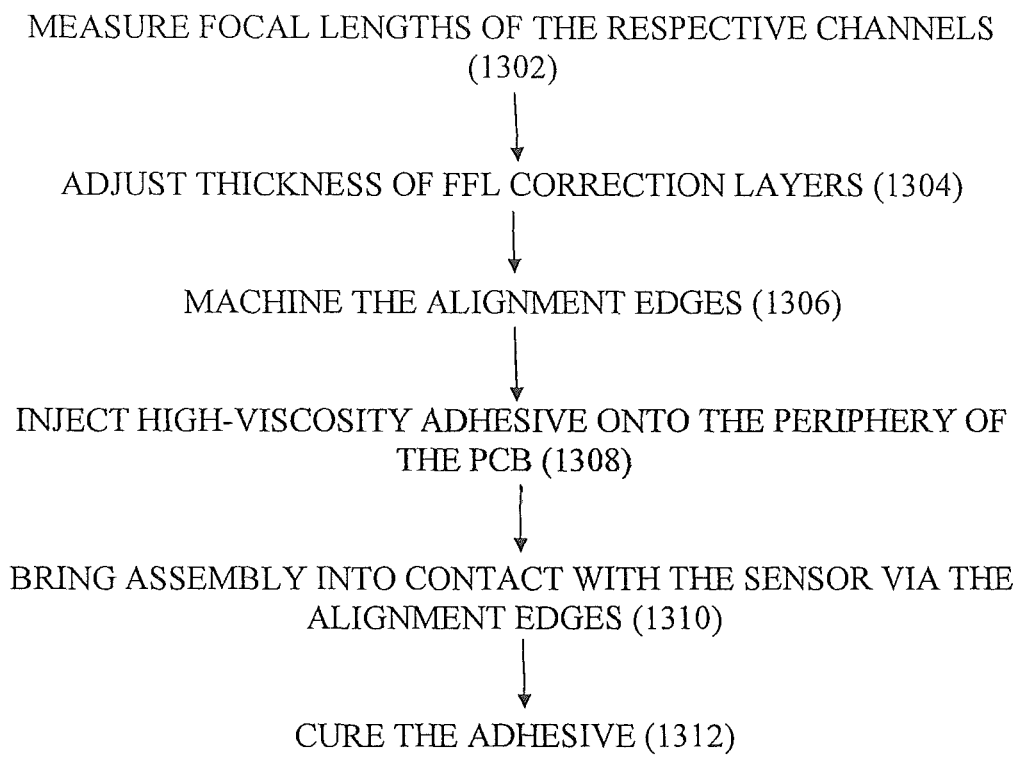
FIG. 13 is a flow chart of a method of assembling the module of FIG. 12A.

Techniques for assembling the modules depicted in FIGS. 12A and 12B are described next. For example, with respect to the multi-channel module of FIG. 12A, an assembly 450 is provided and includes the lens stacks 426, lens barrels 428, transparent cover 438, spacer 442 and the material 446 encircling the cover 438. The focal lengths of the respective channels of the assembly are measured (1302 in FIG. 13), and based on the measurements, the thickness of one or both FFL correction layers 448 may be adjusted such that the focal lengths of the channels are substantially the same (1304). In some cases, the alignment edges 404 may be machined such that the focal lengths of the respective channels are focused on the active region 433 of the sensor 432 (1306). High-viscosity adhesive 410 then is injected onto the periphery of the PCB 434 so as to encircle the sensor 432 (1308). Next, the assembly 450 is brought into contact with the sensor 432 (via the alignment edges 404) (1310). During this latter process, some adhesive 410 is forced under the adhesion edges 406B, with the result that the adhesive 410 may partially encase the electrical connections 436. The adhesive then is cured, for example, using heat, UV or both (1312). In some cases, the cured adhesive 410 is non-transparent to wavelengths of light detectable by the sensor 432.

Figure 14:
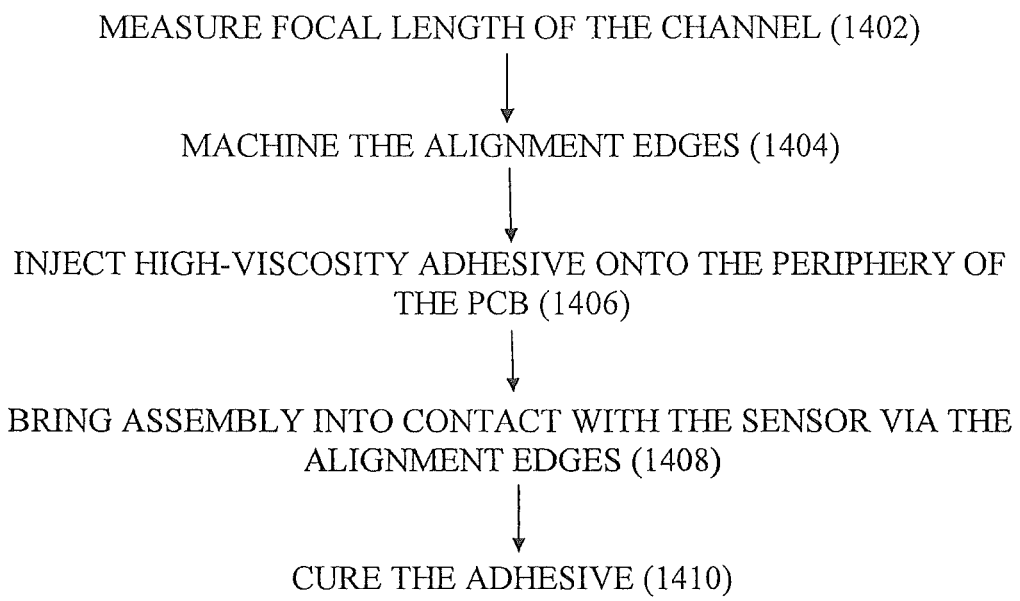
FIG. 14 is a flow chart of a method of assembling the module of FIG. 12B.

To assemble the single-channel module of FIG. 12B, an assembly 452 is provided and includes the lens stacks 426, lens barrels 428, transparent cover 438, spacer 442 and the material 446 encircling the cover 438. The focal length of the channel is measured (1402 in FIG. 14). In some cases, the alignment edges 404 may be machined such that the focal length of the channel is focused on the active region 433 of the sensor 432 (1404). Next, high-viscosity adhesive 410 is injected onto the periphery of the PCB 434 so as to encircle the sensor 432 (1406). The assembly 452 then is brought into contact with the sensor 432 (via the alignment edges 404) (1408). During this latter process, some adhesive 410 is forced under the adhesion edges 406B with the result that the adhesive 410 may partially encase the electrical connections 436. The adhesive 410 then is cured, for example, using heat, UV or both (1410). In some cases, the cured adhesive 410 is non-transparent to wavelengths of light detectable by the sensor 432.

Figure 15:
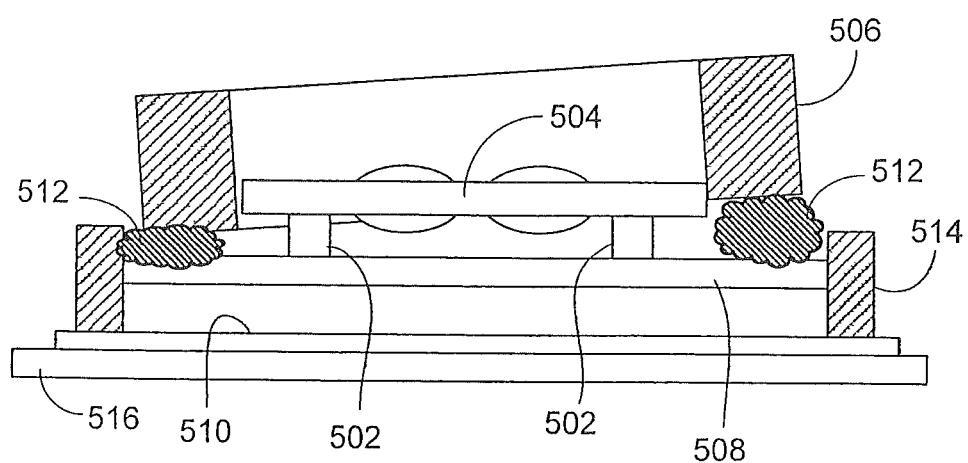
FIG. 15 illustrates an example of a module including features to eliminate or reduce tilt.

In some cases, tilt correction can be addressed in other ways either in addition to, or as an alternative to, the techniques discussed above. For example, in some instances, an optics assembly (e.g., a lens stack) is placed within a lens barrel that is attached, by adhesive, to a transparent plate over the photosensitive part of the image sensor. Unevenness in the adhesive can result in misalignment of the lens barrel such that the lenses are tilted relative to the plane of the image sensor. The tilt, in turn, may result in poor image quality. To help eliminate or reduce the impact of the uneven adhesive, one or more (e.g., three) projections 502 can be provided on the sensor-side of a lens array 504 (see FIG. 15). The projections 502 can be formed, for example, during the same injection molding process used to form the lens array 504. When the lens array 504 is placed into the lens barrel 506, the projection(s) 502 extend beyond the bottom of the lens barrel 506. The projection(s) 502 rest directly on the transparent cover 508 so as to define a fixed distance between the image sensor 510 and the lens array 504, whereas the lens barrel 506 is attached to the transparent cover 508 by adhesive 512. In some cases, instead of multiple projections 502, a single projection in the form of a continuous edge extends from the sensor-side of the lens array and is attached to the transparent cover 508. Any unevenness in the adhesive 512 between the lens barrel 506 and the transparent cover 508 will not result in tilt of the lens array 504. As in the other implementations described above, the transparent cover 508 can be surrounded laterally by a non-transparent spacer 514 that provides a fixed distance between the image sensor 510 and the transparent cover 508. The image sensor 510 can be mounted on a PCB or other substrate 516.

The modules described here can be used, for example, as compact digital cameras that can be integrated into various types of consumer electronics and other devices such as mobile phones, smart phones, personal digital assistants (PDAs) and laptops.

Although the illustrated examples are described in the context of imaging devices that include image sensors, other implementations may include different types of active optoelectronic components, including light emitters (e.g., light emitting diodes (LEDs), infra-red (IR) LEDs, organic LEDs (OLEDs), infra-red (IR) lasers or vertical cavity surface emitting lasers (VCSELs)). In this case, the transparent covers should be substantially transparent to the wavelength(s) of light emitted by the active optoelectronic components.

Some or all of the foregoing features may not be present in some implementations. Further, various features described in connection with different ones of the foregoing examples can be combined in a single implementation. Also, various modifications within the spirit of the invention will be readily apparent to one of ordinary skill. Accordingly, other implementations are within the scope of the claims.

What is claimed is:

1. An optical module comprising:
   a substrate;
   an image sensor on the substrate;
   a transparent plate disposed over the image sensor;
   a beam shaping system disposed over the transparent plate;
   a spacer disposed between a surface of the image sensor and the transparent plate, wherein the spacer includes an alignment edge in direct contact with the surface of the image sensor; and
   material laterally encircling the transparent plate and including an adhesion edge attached to a surface of the substrate by adhesive.

2. The module of claim 1 wherein the adhesion edge is at an outer side surface of the material laterally encircling the transparent plate.

3. The module of claim 2 wherein the outer side surface is substantially perpendicular to the surface of the substrate.

4. The module of claim 1 wherein the alignment edge rests on an inactive surface of the image sensor.

5. The module of claim 1 wherein the adhesive, the alignment edge and the adhesion edge define a cavity, the module further including one or more wires connecting the image sensor to the substrate, wherein the one or more wires are disposed within the cavity.

* * * * *